United States Patent
Ishizuka et al.

(10) Patent No.: US 11,244,852 B2
(45) Date of Patent: Feb. 8, 2022

(54) METHOD FOR MANUFACTURING BONDED SOI WAFER

(71) Applicant: SHIN-ETSU HANDOTAI CO., LTD., Tokyo (JP)

(72) Inventors: Toru Ishizuka, Takasaki (JP); Setsuya Hama, Annaka (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 53 days.

(21) Appl. No.: 16/599,545

(22) Filed: Oct. 11, 2019

(65) Prior Publication Data

US 2020/0152505 A1 May 14, 2020

(30) Foreign Application Priority Data

Nov. 13, 2018 (JP) .............................. JP2018-213278

(51) Int. Cl.
*H01L 21/762* (2006.01)
*H01L 21/18* (2006.01)
(Continued)

(52) U.S. Cl.
CPC ...... *H01L 21/76251* (2013.01); *H01L 21/324* (2013.01)

(58) Field of Classification Search
CPC ............. H01L 21/76251; H01L 21/324; H01L 21/76254; H01L 21/76275; H01L 21/3221; H01L 21/76264; H01L 21/185
See application file for complete search history.

(56) References Cited

U.S. PATENT DOCUMENTS 6,265,326 B1 * 7/2001 Ueno ................ H01L 21/02255
438/767
6,544,656 B1 * 4/2003 Abe ........................ C30B 15/00
428/446
(Continued)

FOREIGN PATENT DOCUMENTS

JP H09-186306 A 7/1997
JP H09-246129 A 9/1997
(Continued)

OTHER PUBLICATIONS

Sep. 28, 2021 Office Action issued in Japanese Patent Application No. 2018-213278.

*Primary Examiner* — Caridad Everhart
(74) *Attorney, Agent, or Firm* — Oliff PLC

(57) ABSTRACT

The present invention is a method for manufacturing a bonded SOI wafer, including: preparing, as a base wafer, a silicon single crystal wafer whose initial interstitial oxygen concentration is 15 ppma or more ('79ASTM); forming a silicon oxide film on a surface of the base wafer by heating the base wafer in an oxidizing atmosphere such that a feeding temperature at which the base wafer is fed into a heat treatment furnace for the heat treatment is 800° C. or more, and the base wafer is heated at the feeding temperature or higher; bonding the base wafer to the bond wafer with the silicon oxide film interposed therebetween; and thinning the bonded bond wafer to form an SOI layer. This provides a method for manufacturing a bonded SOI wafer by a base oxidation method which suppresses the formation of oxide precipitates in a base wafer while suppressing slip dislocation.

8 Claims, 1 Drawing Sheet

(51) Int. Cl.
*H01L 21/322* (2006.01)
*H01L 21/324* (2006.01)

(56) References Cited

U.S. PATENT DOCUMENTS

| | | | |
|---|---|---|---|
| 6,554,656 B2 * | 4/2003 | Hatagishi | H01R 43/18 |
| | | | 264/297.2 |
| 7,141,113 B1 * | 11/2006 | Nakamura | C30B 29/06 |
| | | | 117/3 |
| 11,056,381 B2 * | 7/2021 | Ishizuka | H01L 21/3226 |
| 2008/0124943 A1 * | 5/2008 | Yuasa | H01L 21/0223 |
| | | | 438/773 |
| 2008/0128851 A1 | 6/2008 | Aga et al. | |
| 2018/0247860 A1 | 8/2018 | Ishizuka et al. | |

FOREIGN PATENT DOCUMENTS

| | | |
|---|---|---|
| JP | 2006-080461 A | 3/2006 |
| JP | 2011-054655 A | 3/2011 |
| JP | 2017-069240 A | 4/2017 |

* cited by examiner

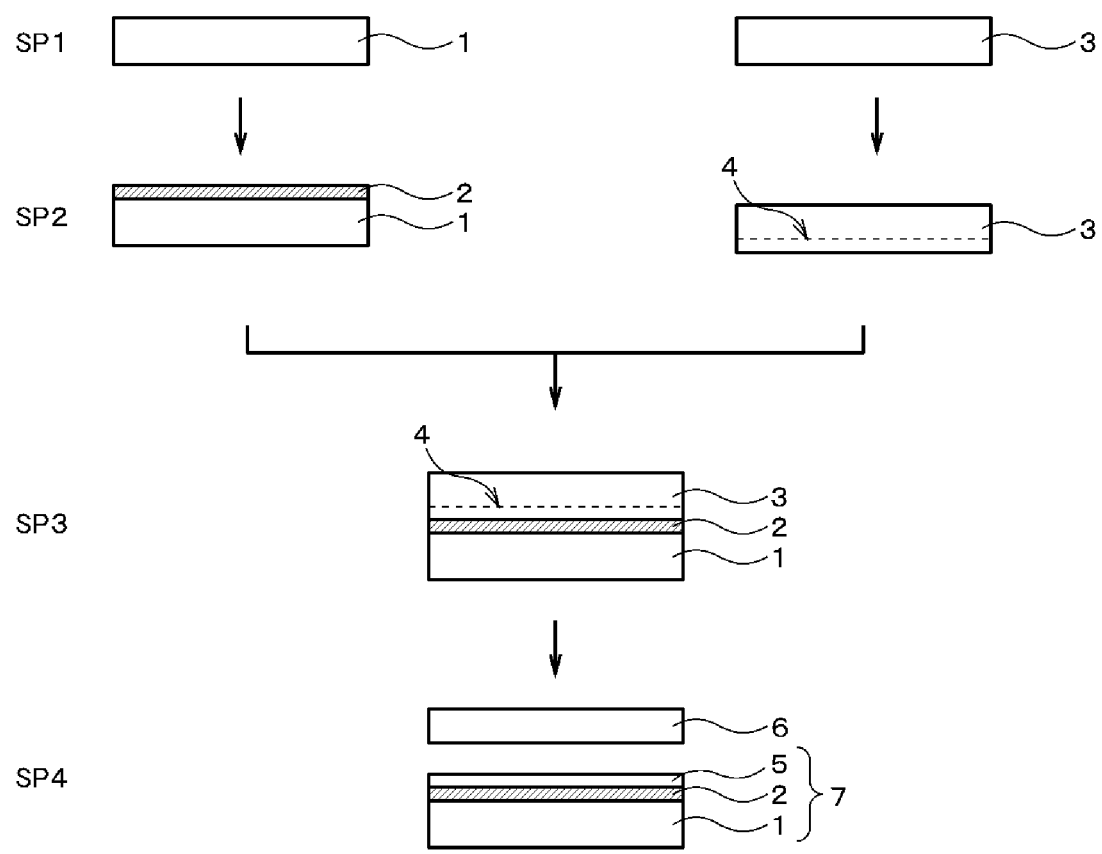

METHOD FOR MANUFACTURING BONDED SOI WAFER

TECHNICAL FIELD

The present invention relates to a method for manufacturing a bonded SOI wafer, in particular, a method for manufacturing a bonded SOI wafer, in which the bonding is performed while a silicon oxide film is formed on a base wafer serving as a supporting substrate of an SOI layer.

BACKGROUND ART

Besides the use as a high-performance CPU, SOI (Silicon On Insulator) is utilized in the field of RF devices and Si Photonics (Silicon Photonics). A technology to integrate functions that have been previously configured by a combination of discrete elements into an Si chip is being developed, and such functions are being improved dramatically.

As bonded SOI is put to more various uses, the required variations of SOI layer thickness/BOX layer (buried oxide film layer) thickness, either thinner or thicker than previously required, are widening.

In Si Photonics, an SOI layer is used as an optical waveguide, and a BOX layer and a surrounding $SiO_2$ layer act as a reflective layer. In order to ensure high reflectance according to the wavelength used, the BOX layer is required to be thicker, and accordingly, the duration of BOX oxidation heat treatment for forming the BOX layer has become longer.

In a method for manufacturing a thin bonded SOI wafer in which delamination is performed using an ion-implanted layer, when a thick BOX layer is formed on the bond wafer side where the SOI layer is formed, it is necessary to deeply implant the ions forming the delamination layer, and the depth is restricted by the upper limit of the accelerating voltage of the ion implanter. Accordingly, in order to fabricate an SOI wafer with a BOX layer of a certain thickness or thicker, a method is adopted in which an SOI wafer is manufactured by forming a BOX layer on the base wafer side, but not on the bond wafer side into which the ions are implanted, followed by bonding. This is referred to as a base oxidation SOI method (hereinafter, also referred to as a base oxidation method).

When a BOX layer is formed by the base oxidation method, before the heat treatments to reinforce bonding strength after delamination and to adjust the surface roughness and film thickness in the SOI process, a BOX oxidation heat treatment step is performed on the base wafer side. Therefore, more time is spent for heating the base wafer. In particular, when manufacturing an SOI wafer with a thick BOX layer, the BOX oxidation heat treatment can take an extremely long time.

CITATION LIST

Patent Literature

Patent Document 1: Japanese Unexamined Patent Application Publication No. 2017-69240
Patent Document 2: Japanese Unexamined Patent Application Publication No. 2006-80461

SUMMARY OF INVENTION

Technical Problem

When configurations such as vertical holes and grooves are formed by etching a base wafer of an SOI wafer, oxide precipitates in the base wafer can impede the etching and obstruct the formation of the configurations. Therefore, depending on the purpose, it is desirable to make the density and the size of the oxide precipitates of the base wafer as small as possible. However, when a BOX oxidation heat treatment is performed for a long time on the base wafer in order to form a thick BOX layer, the oxide precipitates in the base wafer also grow and the density and the size thereof increase. Thus, in an SOI wafer manufactured by using a base oxidation method, suppressing and reducing the oxide precipitates of the base wafer have been an essential task.

On the other hand, as a method for suppressing the density and the size of the oxide precipitates formed when the BOX oxidation heat treatment is performed for a long time, the use of a silicon single crystal wafer with a low oxygen concentration (for example, less than 15 ppma ('79ASTM)) as the base wafer can be considered. For example, Patent Document 1 discloses a technology to fabricate an SOI wafer with a thick BOX layer by the base oxidation method, and discloses that a base wafer of Oi (initial interstitial oxygen concentration)≤10 ppma ('79ASTM) is oxidized for 5 hours or more at a temperature of 700° C. to 1000° C. However, a wafer with such low oxygen concentration has the problem that slip dislocation occurs as a result of heat treatment. In addition, there is no disclosure concerning BMD and the feeding temperature at the time of oxidation in Patent Document 1.

Further, Patent Document 2 discloses in claim 8 that RTO is performed as a nucleus killer heat treatment which is performed before the bonding heat treatment. However, Patent Document 2 concerns a method for manufacturing a bonded SOI wafer in which a BOX layer is formed on the bond wafer side.

In view of the above-described problems, it is an object of the present invention to provide a method for manufacturing a bonded SOI wafer by a base oxidation method, in which the formation of oxide precipitates in the base wafer is suppressed while the occurrence of slip dislocation is suppressed.

Solution to Problem

To overcome the problems, the present invention provides a method for manufacturing a bonded SOI wafer by bonding a bond wafer and a base wafer, both of which are formed from a silicon single crystal, with a silicon oxide film interposed therebetween, comprising the steps of:

preparing, as the base wafer, a silicon single crystal wafer whose initial interstitial oxygen concentration is 15 ppma or more as determined by '79ASTM;

forming the silicon oxide film, wherein when forming the silicon oxide film on a surface of the base wafer by performing a heat treatment on the base wafer in an oxidizing atmosphere, a feeding temperature at which the base wafer is fed into a heat treatment furnace for performing the heat treatment is set to 800° C. or more, and the heat treatment on the base wafer is performed at the feeding temperature or a higher temperature;

bonding the base wafer to the bond wafer with the silicon oxide film interposed therebetween; and thinning the bonded bond wafer to form an SOI layer.

Thus, by setting the feeding temperature to 800° C. or more, oxide precipitate nuclei can be reduced, or the growth of the oxide precipitate nuclei can be suppressed. In addition, by using a wafer with a suitably high initial interstitial oxygen concentration as the base wafer, the occurrence of slip dislocation is suppressed.

Here, the base wafer may have a diameter of 200 mm or more.

Even when the base wafer has such a large diameter, the present invention can suppress an occurrence of a slip dislocation.

Further, before the heat treatment, an RTA heat treatment is preferably performed on the base wafer at a temperature of 800° C. or more.

Thus, oxide precipitate nuclei can be reduced, or the growth of the oxide precipitate nuclei can be suppressed, and as a result, the density and the size of the oxide precipitates can be made small.

Further, in the step of forming the silicon oxide film, the silicon oxide film formed on the surface of the base wafer may have a thickness of 1 μm or more.

Thus, the present invention can form a thick BOX layer (silicon oxide film) while suppressing slip dislocation and formation of oxide precipitates.

Advantageous Effects of Invention

As described above, the method for manufacturing a bonded SOI wafer of the present invention employing a base oxidation method makes it possible to reduce oxide precipitate nuclei or suppress the growth of the oxide precipitate nuclei while suppressing the occurrence of a slip dislocation, and as a result, the density and the size of the oxide precipitates can be reduced. In addition, a bonded SOI wafer with a BOX layer of a desired thickness can be manufactured efficiently.

BRIEF DESCRIPTION OF DRAWINGS

FIG. 1 is an explanatory diagram showing an example of steps of a method for manufacturing a bonded SOI wafer of the present invention.

DESCRIPTION OF EMBODIMENTS

Hereinafter, the present invention will be described in detail, but the present invention is not restricted thereto.

As stated above, the required thickness of a BOX layer of a bonded SOI wafer is increasing. For this reason, the BOX oxidation heat treatment is performed for a longer time. However, the oxide precipitates in the base wafer grow and the density and the size of the oxide precipitates also become large. Therefore, there are demands for the development of a method for manufacturing a bonded SOI wafer, which suppresses the formation of oxide precipitates in the base wafer.

The density and the size of the oxide precipitates are also changed by the heat treatments to adjust the surface roughness and the film thickness after delamination in the SOI wafer manufacturing process, and it is possible to reduce the density of the oxide precipitates under appropriate conditions. However, regarding a base wafer which has gone through the SOI process of the base oxidation method, in particular, a base wafer which has a thick BOX layer and has gone through a long BOX oxidation heat treatment (heat treatment in an oxidizing atmosphere), it has been observed that the heat treatment in the SOI wafer manufacturing process after the delamination has relatively small influence on the oxide precipitates, whereas the oxide precipitates formed by the initial BOX oxidation heat treatment remain dominant. Thus, the present inventors have discovered that it is important to suppress the formation of oxide precipitates at the time of the initial BOX oxidation heat treatment as much as possible.

As a means to achieve this, at the time of the initial BOX oxidation heat treatment, the heat treatment is started at as high a temperature as possible so that the formation of oxide precipitate nuclei at a low temperature is suppressed and the density and the size of the precipitates are suppressed. In this way, even if the subsequent heat treatment is performed, the density and the size of the oxide precipitates can be suppressed. More specifically, the feeding temperature at which the base wafer is fed into a heat treatment furnace that is used for the BOX oxidation heat treatment is set to a high temperature of 800° C. or more; more preferably, before this treatment in the heat treatment furnace, an RTA heat treatment is performed on the base wafer at a high temperature of 800° C. or more. Thus, the present inventors have discovered that, in this way, oxide precipitate nuclei can be reduced, or the growth of the oxide precipitate nuclei can be suppressed, and as a result, the density and the size of the oxide precipitates can be reduced. Hence, the present invention has been completed.

Nevertheless, when the initial interstitial oxygen concentration of the base wafer is less than 15 ppma ('79ASTM), there is a problem that setting the feeding temperature to 800° C. or more makes a slip dislocation more liable to occur. The larger the diameter of the wafer, the more this slip dislocation is liable to occur; a slip dislocation is liable to occur when heating a wafer with a diameter of 200 mm or more, in particular a wafer with a diameter of 300 mm or more. It is to be noted that, when a wafer with such a large diameter is heated, a slip dislocation is generally avoided by setting the feeding temperature at which the wafer is fed into the heat treatment furnace to a low temperature of around 500° C. to 700° C.

In comparison, the present invention suppresses the occurrence of a slip dislocation by using a wafer whose oxygen concentration is suitably high, to compensate for the difficulty of suppressing the occurrence of a slip dislocation due to the feeding temperature being 800° C. or more.

Specifically, the present invention is a method for manufacturing a bonded SOI wafer by bonding a bond wafer and a base wafer, both of which are formed from a silicon single crystal, with a silicon oxide film interposed therebetween, comprising the steps of:

preparing, as the base wafer, a silicon single crystal wafer whose initial interstitial oxygen concentration is 15 ppma or more as determined by '79ASTM;

forming the silicon oxide film, wherein when forming the silicon oxide film on a surface of the base wafer by performing a heat treatment on the base wafer in an oxidizing atmosphere, a feeding temperature at which the base wafer is fed into a heat treatment furnace for performing the heat treatment is set to 800° C. or more, and the heat treatment on the base wafer is performed at the feeding temperature or a higher temperature;

bonding the base wafer to the bond wafer with the silicon oxide film interposed therebetween; and thinning the bonded bond wafer to form an SOI layer.

Hereinafter, the method for manufacturing a bonded SOI wafer of the present invention as described above will be explained with reference to the drawing, but the present invention is not limited thereto.

As shown in FIG. 1, first, a silicon single crystal wafer whose initial interstitial oxygen concentration is 15 ppma ('79ASTM) or more is prepared as a base wafer 1 (FIG. 1, SP1).

In addition, as a bond wafer 3, a silicon single crystal wafer is prepared. The oxygen concentration of the bond wafer 3 is not particularly limited.

As a base wafer for Si Photonics application, a commonly used wafer with a normal resistivity (1 to 20 Ω·cm) and an oxygen concentration of 15 ppma ('79ASTM) or more can be selected. Although the upper limit of the oxygen concentration is not restricted, 25 ppma is enough. From such a range of oxygen concentration, a high resistance wafer is sometimes selected considering improvement of RF characteristics. In such a case, the wafer with a low oxygen concentration is selected in order to suppress decrease in resistivity due to oxygen donors. However, when forming a thick BOX layer, it is desirable to select a wafer with a certain level of oxygen concentration in order to suppress the occurrence of a slip during the BOX oxidation heat treatment. However, it can be predicted that if the oxygen concentration is higher, the density and the size of the oxide precipitates formed by heat treatment also become large.

If the initial interstitial oxygen concentration of the base wafer 1 is less than 15 ppma ('79ASTM), setting the feeding temperature at which the base wafer is fed into the heat treatment furnace to 800° C. or more as described below makes a slip dislocation more likely to occur. On the other hand, when the initial interstitial oxygen concentration of the base wafer 1 is 15 ppma ('79ASTM) or more, such a slip dislocation can be suppressed.

The diameter of the base wafer 1 can be set to 200 mm or more. As stated above, the greater the diameter of the wafer, the more a slip dislocation is likely to occur. The present invention suppresses such slip dislocation by using a base wafer with a high initial interstitial oxygen concentration of 15 ppma ('79ASTM) or more.

Next, by performing a heat treatment on the base wafer 1 in an oxidizing atmosphere (BOX oxidation heat treatment), a silicon oxide film 2 is formed on the surface of the base wafer 1 (FIG. 1, SP2).

When the silicon oxide film 2 is being formed, if the oxidation heat treatment temperature is high and the treatment time is long, the density and the size of the oxide precipitates tend to become large. This trend depends greatly on the density of the oxide precipitate nuclei that are formed while the base wafer goes through a low-temperature heat history before reaching the oxidation heat treatment temperature. Therefore, in order to reduce the time for which the base wafer is under a low-temperature heat history, the present invention sets the feeding temperature at which the base wafer is fed into the furnace (in the case of a batch processing vertical furnace, the temperature at which the boat is placed into the furnace) to a high temperature.

Normally, the furnace is allowed to stand by at 500° C. or 600° C. and then the base wafer is fed into the furnace, whereas in the present invention, the temperature is set to 800° C. or higher. Thus, by beginning the above heat treatment in such a high temperature, the oxide precipitate nuclei can be reduced, or the growth of the oxide precipitate nuclei can be suppressed. Such a result cannot be obtained with a feeding temperature less than 800° C. There is no particular restriction to the upper limit of the feeding temperature as long as the slip dislocation can be suppressed, but the feeding temperature is preferably 1050° C. or less, more preferably 1000° C. or less.

The BOX oxidation heat treatment by which the silicon oxide film 2 is formed is performed at the feeding temperature or higher.

For the BOX oxidation heat treatment, a batch processing vertical furnace is generally used. In order to increase the growth rate of the oxide film, steam oxidation is often selected, and the oxidation heat treatment temperature is also often set high.

Further, before the heat treatment in the batch processing vertical furnace, it is preferable to perform an RTA heat treatment on the base wafer 1 at a temperature of 800° C. or more.

More specifically, using a single-wafer-processing lamp heating RTA apparatus, a pre-heat treatment (RTO heat treatment) can be performed at a temperature of 800° C. or a temperature higher than 800° C., for example, at 1000° C. in an oxidizing atmosphere. In this case, the generation of oxide precipitate nuclei can be suppressed, and further, oxide precipitate nuclei disappear and the density can be reduced. Even when the heat treatment etc. are performed in the batch processing vertical furnace subsequently, the density does not get increased because the pre-heat treatment (RTO heat treatment) has been performed.

In addition, by adopting an oxidizing atmosphere, surface roughness of the wafer surface can be reduced.

In the step of forming the silicon oxide film 2 (SP2), the thickness of the silicon oxide film 2 which is formed on the surface of the base wafer 1 can be set to 1 μm or more. Thus, according to the present invention, the silicon oxide film 2 (BOX layer) of the desired thickness can be formed while the formation of oxide precipitates or a slip dislocation is suppressed.

On the other hand, the bond wafer 3 prepared for bonding may be ion-implanted to form an ion-implanted layer 4 for delamination, and be subjected to pre-bonding cleaning. Ion species for the ion implantation include hydrogen ions and helium ions. The conditions of the ion implantation such as dosage and accelerating voltage may be determined appropriately depending on the required thickness of the final SOI layer, the thickness of the stock removal from the SOI layer thickness during the SOI manufacturing process, etc.

After forming the silicon oxide film 2 on the surface of the base wafer 1 by performing the oxidation heat treatment on the base wafer 1, the base wafer 1 and the bond wafer 3 are bonded with the silicon oxide film 2 interposed between the base wafer 1 and the bond wafer (FIG. 1, SP3).

Next, the bonded bond wafer 3 is thinned and an SOI layer 5 is formed (FIG. 1, SP4).

More specifically, a delamination heat treatment is performed on the bonded wafers 1 and 3 for delamination at the ion-implanted layer 4. Thereby, a thin bonded SOI wafer 7 is obtained, which is the base wafer 1 with the silicon oxide film 2 and the SOI layer 5 formed thereon. Incidentally, in this event, a delaminated wafer 6 is derived, which can be reused as a new bond wafer 3.

Subsequently, a bonding heat treatment for enhancing the bonding strength between the SOI layer 5 and the base wafer 1 and/or a heat treatment for adjusting the surface roughness or the SOI layer thickness may be performed. These heat treatments may be performed in a high temperature compared to the initial BOX oxidation heat treatment, but the duration of the heat treatments is not as long as that of the BOX oxidation heat treatment.

The method for manufacturing a bonded SOI wafer according to the present invention as described above can suppress the formation of the oxide precipitates in the base wafer 1 while suppressing the occurrence of the slip dislocation. In addition, the bonded SOI wafer 7 with a BOX layer of the desired thickness can be manufactured efficiently.

It is to be noted that, although it has been described above as an example that the bond wafer 3 is thinned by the formation of the ion-implanted layer 4 and the delamination at the ion-implanted layer 4, the present invention is not limited thereto. For example, the bond wafer 3 can be thinned by a combination of grinding, polishing, etching, etc.

EXAMPLE

Hereinafter, the present invention will be specifically described with reference to Examples and Comparative Examples. However, the present invention is not limited thereto.

Bonded SOI wafers 7 were manufactured with the following materials and conditions by the inventive method for manufacturing a bonded SOI wafer in accordance with the explanatory diagram shown in FIG. 1.

Example 1

As a base wafer 1, a silicon single crystal wafer with a diameter of 300 mm, a crystal orientation of <100>, and an initial interstitial oxygen concentration of 21 ppma ('79ASTM) was prepared. By performing an oxidation heat treatment on this base wafer 1 using a batch processing vertical oxidizing furnace in an oxidizing atmosphere at 1000° C., a silicon oxide film (BOX layer) 2 of 2 μm was formed on the top surface of the base wafer 1. At this time, the base wafer 1 was fed into the vertical furnace at a feeding temperature of 800° C.

The base wafer 1 was bonded to a bond wafer 3 (a silicon single crystal wafer with a diameter of 300 mm and a crystal orientation of <100>) which had been ion-implanted, with the silicon oxide film 2 of 2 μm interposed therebetween, a delamination was performed by a delamination heat treatment, and thus, a bonded SOI wafer 7 with an SOI structure was formed. After the delamination, an oxidation heat treatment for enhancing the bonding strength was performed, and an RTA heat treatment for adjusting the surface roughness was performed. The bonded SOI wafer 7 was adjusted to a final thickness, and the oxide precipitate density of the base wafer 1 was measured using LST (Laser Scattering Tomography). The result was $1 \times 10^8$ pcs/cc.

In addition, observing the back surface of the base wafer 1 of the fabricated bonded SOI wafer 7 under a light-condensing lamp, no slip dislocation was found.

Example 2

As a base wafer 1, a silicon single crystal wafer with a diameter of 300 mm, a crystal orientation of <100>, and an initial interstitial oxygen concentration of 21 ppma ('79ASTM) was prepared. A heat treatment was performed on this base wafer 1 for 60 seconds at 1000° C. using a single-wafer-processing lamp heating RTA apparatus with an oxygen atmosphere. Subsequently, by performing an oxidation heat treatment using a batch processing vertical oxidizing furnace in an oxidizing atmosphere at 1000° C., a silicon oxide film 2 of 2 μm was formed on the top surface of the base wafer 1. At this time, the base wafer 1 was fed into the vertical furnace at a feeding temperature of 800° C.

The base wafer 1 was bonded to a bond wafer 3 (a silicon single crystal wafer with a diameter of 300 mm and a crystal orientation of <100>) which had been ion-implanted, with the silicon oxide film 2 of 2 μm interposed therebetween, a delamination was performed by a delamination heat treatment, and thus, a bonded SOI wafer 7 with an SOI structure was formed. After the delamination, an oxidation heat treatment for enhancing the bonding strength was performed, and an RTA heat treatment for adjusting the surface roughness was performed. The bonded SOI wafer 7 was adjusted to a final thickness, and the oxide precipitate density of the base wafer 1 was measured using LST. The result was $1 \times 10^7$ pcs/cc.

In addition, observing the back surface of the base wafer 1 of the fabricated bonded SOI wafer 7 under a light-condensing lamp, no slip dislocation was found.

Comparative Example 1

As a base wafer 1, a silicon single crystal wafer with a diameter of 300 mm, a crystal orientation of <100>, and an initial interstitial oxygen concentration of 21 ppma ('79ASTM) was prepared. By performing an oxidation heat treatment on this base wafer 1 using a batch processing vertical oxidizing furnace in an oxidizing atmosphere at 1000° C., a silicon oxide film 2 of 2 μm was formed on the top surface of the base wafer 1. At this time, the base wafer 1 was fed into the vertical furnace at a feeding temperature of 600° C.

The base wafer 1 was bonded to a bond wafer 3 (a silicon single crystal wafer with a diameter of 300 mm and a crystal orientation of <100>) which had been ion-implanted, with the silicon oxide film 2 of 2 μm interposed therebetween, a delamination was performed by a delamination heat treatment, and thus, a bonded SOI wafer 7 with an SOI structure was formed. After the delamination, an oxidation heat treatment for enhancing the bonding strength was performed, and an RTA heat treatment for adjusting the surface roughness was performed. The bonded SOI wafer 7 was adjusted to a final thickness, and the oxide precipitate density of the base wafer 1 was measured using LST. The result was $7 \times 10^8$ pcs/cc.

In addition, observing the back surface of the base wafer 1 of the fabricated bonded SOI wafer 7 under a light-condensing lamp, no slip dislocation was found.

Comparative Example 2

As a base wafer 1, a silicon single crystal wafer with a diameter of 300 mm, a crystal orientation of <100>, and an initial interstitial oxygen concentration of 12 ppma ('79ASTM) was prepared. By performing an oxidation heat treatment on this base wafer 1 using a batch processing vertical oxidizing furnace in an oxidizing atmosphere at 1000° C., a silicon oxide film 2 of 2 μm was formed on the top surface of the base wafer 1. At this time, the base wafer 1 was fed into the vertical furnace at a feeding temperature of 800° C.

The base wafer 1 was bonded to a bond wafer 3 (a silicon single crystal wafer with a diameter of 300 mm and a crystal orientation of <100>) which had been ion-implanted, with the silicon oxide film 2 of 2 μm interposed therebetween, a delamination was performed by a delamination heat treatment, and thus, a bonded SOI wafer 7 with an SOI structure was formed. After the delamination, an oxidation heat treatment for enhancing the bonding strength was performed, and an RTA heat treatment for adjusting the surface roughness was performed. The bonded SOI wafer 7 was adjusted to a final thickness, and the oxide precipitate density of the base wafer 1 was measured using LST. The result was $1 \times 10^7$ pcs/cc.

However, observing the back surface of the base wafer 1 of the fabricated bonded SOI wafer 7 under a light-condensing lamp, many slip dislocations were observed.

The results are shown in Table 1.

TABLE 1

| | | Example 1 | Example 2 | Comparative Example 1 | Comparative Example 2 |
|---|---|---|---|---|---|
| Base wafer 1 | Diameter [mm] | 300 | 300 | 300 | 300 |
| | Initial interstitial oxygen concentration [ppma ('79ASTM)] | 21 | 21 | 21 | 12 |
| | Feeding temperature [° C.] | 800 | 800 | 600 | 800 |
| | Temperature of heat treatment for forming silicon oxide film [° C.] | 1000 | 1000 | 1000 | 1000 |
| | Whether RTA heat treatment was performed or not before heat treatment for forming silicon oxide film | Not performed | Performed | Not performed | Not performed |
| | Density of oxide precipitates [pcs/cc] | $1 \times 10^8$ | $1 \times 10^7$ | $7 \times 10^8$ | $1 \times 10^7$ |
| | Slip dislocation | None | None | None | Many |

From the results shown in Table 1, it can be seen that, in Examples 1 and 2 in each of which the initial interstitial oxygen concentration of the base wafer 1 was set to 15 ppma ('79ASTM) or more and the base wafer 1 was fed into the heat treatment furnace at a feeding temperature of 800° C., the density of the oxide precipitates was suppressed while the slip dislocation was also suppressed compared to Comparative Example 1 or 2 even when the base wafer with a diameter of 300 mm was used.

In Example 2, unlike in Example 1, an RTA heat treatment was performed before the oxidation heat treatment for forming the silicon oxide film 2. It can be seen that even when this pre-heat treatment is performed, the effect of the present invention of suppressing the occurrence of a slip dislocation is not affected. In addition, in Example 2, it can be seen that the density of the oxide precipitates in the base wafer was suppressed further.

Further, in every Example and Comparative Example, after the silicon oxide film 2 was formed, the delamination heat treatment, the oxidation heat treatment for enhancing the bonding strength, and the RTA heat treatment for adjusting the surface roughness were performed on the base wafer 1, so that the duration of the heat treatments on the base wafer 1 was long. Therefore, it is conjectured that the density of the oxide precipitates would be greater. However, the results of Examples 1, 2 and Comparative Example 2 suggest that the initial heat treatment temperature (feeding temperature) of the base wafer 1 is dominant in the formation of the oxide precipitates.

On the other hand, in Comparative Example 1, although the initial interstitial oxygen concentration of the base wafer 1 was more than 15 ppma ('79ASTM), the feeding temperature into the heat treatment furnace was less than 800° C. Hence, it can be conjectured that the density of the oxide precipitates was not successfully suppressed.

Meanwhile, in Comparative Example 2, although the feeding temperature into the heat treatment furnace was 800° C., the initial interstitial oxygen concentration of the base wafer 1 was less than 15 ppma ('79ASTM). Hence, presumably many slip dislocations occurred.

Thus, it has been shown that the inventive method for manufacturing a bonded SOI wafer makes it possible to reduce the density of the oxide precipitates in the base wafer while suppressing slip dislocation.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A method for manufacturing a bonded SOI wafer by bonding a bond wafer and a base wafer, both of which are formed from a silicon single crystal, with a silicon oxide film interposed therebetween, comprising the steps of:
    preparing, as the base wafer, a silicon single crystal wafer whose initial interstitial oxygen concentration is 15 ppma or more as determined by '79ASTM;
    forming the silicon oxide film before bonding the bond wafer and the base wafer, wherein when forming the silicon oxide film on a surface of the base wafer by performing a heat treatment on the base wafer in an oxidizing atmosphere, a temperature of a heat treatment furnace is set to 800° C. or more before the base wafer is fed into the heat treatment furnace such that a feeding temperature of 800° C. or more is maintained when the base wafer is fed into the heat treatment furnace for performing the heat treatment, and thereafter the heat treatment on the base wafer is performed at the feeding temperature or a higher temperature;
    bonding the base wafer to the bond wafer with the silicon oxide film interposed therebetween; and
    thinning the bonded bond wafer to form an SOI layer.

2. The method for manufacturing a bonded SOI wafer according to claim 1, wherein the base wafer has a diameter of 200 mm or more.

3. The method for manufacturing a bonded SOI wafer according to claim 1, wherein before the heat treatment, an RTA heat treatment is performed on the base wafer at a temperature of 800° C. or more.

4. The method for manufacturing a bonded SOI wafer according to claim 2, wherein before the heat treatment, an RTA heat treatment is performed on the base wafer at a temperature of 800° C. or more.

5. The method for manufacturing a bonded SOI wafer according to claim 1, wherein in the step of forming the silicon oxide film, the silicon oxide film formed on the surface of the base wafer has a thickness of 1 µm or more.

6. The method for manufacturing a bonded SOI wafer according to claim 2, wherein in the step of forming the silicon oxide film, the silicon oxide film formed on the surface of the base wafer has a thickness of 1 µm or more.

7. The method for manufacturing a bonded SOI wafer according to claim 3, wherein in the step of forming the silicon oxide film, the silicon oxide film formed on the surface of the base wafer has a thickness of 1 µm or more.

8. The method for manufacturing a bonded SOI wafer according to claim 4, wherein in the step of forming the silicon oxide film, the silicon oxide film formed on the surface of the base wafer has a thickness of 1 µm or more.

* * * * *